US006953982B1

(12) United States Patent
Tai et al.

(10) Patent No.: US 6,953,982 B1
(45) Date of Patent: Oct. 11, 2005

(54) FLEXIBLE SKIN INCORPORATING MEMS TECHNOLOGY

(75) Inventors: Yu-Chong Tai, Pasadena, CA (US); Fukang Jiang, Pasadena, CA (US); Chihming Ho, Brentwood, CA (US)

(73) Assignee: California Institute of Technology, Pasadena, CA (US)

( * ) Notice: Subject to any disclaimer, the term of this patent is extended or adjusted under 35 U.S.C. 154(b) by 510 days.

(21) Appl. No.: 09/567,818

(22) Filed: May 9, 2000

Related U.S. Application Data

(62) Division of application No. 09/012,756, filed on Jan. 23, 1998, now Pat. No. 6,071,819.

(60) Provisional application No. 60/036,252, filed on Jan. 24, 1997.

(51) Int. Cl.[7] .............................................. H01L 29/00

(52) U.S. Cl. ...................... 257/522; 257/664; 257/738; 257/792; 438/53; 438/113

(58) Field of Search ........................... 438/48–54, 113, 438/126, 460, 712, 734, 735, 753, 717, 656; 257/522, 664, 735, 792; 215/2, 16, 69

(56) References Cited

U.S. PATENT DOCUMENTS

| | | | | |
|---|---|---|---|---|
| 4,587,719 | A | * | 5/1986 | Barth .......................... 438/113 |
| 5,511,428 | A | * | 4/1996 | Goldberg et al. .............. 73/777 |
| 5,573,679 | A | * | 11/1996 | Mitchell et al. ................ 216/2 |
| 5,883,310 | A | * | 3/1999 | Ho et al. ........................ 73/766 |
| 5,888,845 | A | * | 3/1999 | Bashir et al. ................... 216/2 |
| 6,051,854 | A | * | 4/2000 | Vigna et al. ................. 257/252 |

OTHER PUBLICATIONS

Barth et al., "Flexible Circuit and Sensor Arrays Fabricated by Monolithic Silicon Technology", Jul. 1985, IEEE Trans. Electron. Device, vol. ED-32, No. 7, pp. 1202-1205.*
Beebe et al., "a Flexible Polymide-Based Package for Silicon Sensors", Jul. 1994, Sensors and Actuators, vol. A44, pp. 57-64.*
F. Jiang, et al. "A Surface-Micormachined Shear Stress Imager," Jun. 1995, IEEE. pp. 110-115.
P.W. Barth, et al. "Flexible Circuit and Sensor Arrays Fabricated by Monolithic Silicon Technology", Jul. 1985, IEEE Trans. Electron. Devices, vol. ED-32, No. 7, pp. 1202-1205.
D.J. Beebe, et al. "A Flexible Polyimide-Based Package for Silicon Sensors", Jul. 1994. Sensors and Accuators, vol. A44, pp. 57-64.
C. Bang, et al. "Flexible Heat Flux Sensor Arrays", Sep. 4-6, 1996, AFOSR Contractor and Grantee Meeting on Turbulence and Internal Flows, Atlanta, Georgia.
DuPont Electronic Materials, Pyralin Polyimide Product Information, PI 2801, PT 2303 & PI 2309, 1994.
DuPont, Kapton Polyimide Film Product Information.
B. Gupta, et al., "Analog VLST System for Active Drag Reduction", Oct. 1996, IEEE, Micro, vol. 16, No. 5, pp. 53-59.
B. J. Bellhouse, et al. "Determination of Mean and Dynamic Skin Friction, Seperation and Transition in Low-Speed Flow with a Thin-Film Heated Element", 1966, Journal of Fluid Mechanics, vol. 24, part 2, pp. 379-400.

(Continued)

*Primary Examiner*—Duy-Vu N. Deo
(74) *Attorney, Agent, or Firm*—Fish & Richardson P.C.

(57) ABSTRACT

A flexible skin formed of silicon islands encapsulated in a polyimide film. The silicon islands preferably include a MEMS device and are connected together by a polyimide film (preferably about 1–100 μm thick). To create the silicon islands, silicon wafers are etched to a desirable thickness (preferably about 10–500 μm) by Si wet etching and then patterned from the back side by reactive ion etching (RIE).

15 Claims, 6 Drawing Sheets

OTHER PUBLICATIONS

Elmar Achenbach, "Total and Local Heat Transfer from a Smooth Circular Cylinder in Cross-Flow at High Reynolds Number", 1975, Int'l. Journal of Heat and Mass Transfer, vol. 13, pp. 1387-1395.

G. B. Lee, et al. "Distributed Flow Control by MEMS," Nov. 17-22, 1996, ASME 1996 International Mechanical Engineering Congress and Exposition, Atlanta, Georgia.

* cited by examiner

FLEXIBLE SKIN INCORPORATING MEMS TECHNOLOGY

This application claims the benefit of U.S. Provisional Application No. 60/036,252, filed Jan. 24, 1997. This application is a DIV of Ser. No. 09/012,756, now U.S. Pat. No. 6,071,819.

The Government may have certain rights based on Grant No. F49620-94-1-0008 awarded by the U.S. Air Force.

FIELD OF THE INVENTION

The invention relates to flexible materials, and more particularly to flexible skins which include microelectromechanical systems (MEMS) devices.

BACKGROUND OF THE INVENTION

Microelectromechanical systems (MEMS) devices include semiconductor chips which include microfabricated mechanical systems on the chip, such as sensors.

For some applications, it is desirable to obtain real-time 2-D profiling of certain physical parameters such as temperature, force, pressure or shear stress on a 3-D object. If the surface of the object is flat, this profiling can be achieved by using a monolithic MEMS device with a large amount of sensors. However, such MEMS devices are typically rigid and flat. Profiling becomes much more difficult if the surface is not flat.

For example, in aerodynamics study, research objects such as an airfoil have non-planar and high-curvature surfaces. Previous attempts to achieve real-time distribution measurement embedded the discrete sensors on a surface. However, large sensor size and difficulty in packaging, i.e., plumbing and wiring, have long been limiting factors to realizing good measurements.

Barth et al. in 1985 reported a one-dimensional flexible Si-diode temperature sensor array in which a polyimide strip was used as a flexible material connecting Si islands formed by isotropic hydrofluoric, nitric, and acetic acid ("HNA") etching. Here, polyimide refers to a polymer of imide compounds, those that contain the =NH group. However, this technology needed some major improvements before it could be applied to more complicated sensor systems.

In 1994, Beebe and Denton presented their effort on improving the robustness and reliability of flexible polyimide skins which did not include any devices. The authors identified a major cause of failure as breaks in thin silicon on the island periphery. The methods used to enhance the robustness, including the application of tape and coating of epoxy on both front and back sides of the skins, were all performed manually as post-processing steps. These methods are not an ideal solution for a reliable as well as mass-producible smart skin technology.

Bang and Pan have an on-going project to develop a flexible heat-flux sensor array which is made by direct deposition of thin-film metals on commercial Kapton™ substrates. A large array of metal temperature sensors can be made in this way, but neither ICs nor silicon MEMS are easily integrated with this approach. Hence, only limited types of sensors are available using this approach and a hybrid assembly of electronic circuits is not readily avoidable.

SUMMARY OF THE INVENTION

The present disclosure provides a flexible MEMS technology to produce "smart skins" with integrated MEMS devices that can be easily affixed to non-planar surfaces.

The invention provides the integration of MEMS devices on a flexible skin through a new microfabrication technology. Many individual Si islands are used for silicon MEMS/electronics devices. These Si islands are connected together by a polyimide film. To create the Si islands, Si wafers are etched and then patterned from the back side.

The present invention includes a new flexible skin technology that is compatible with both IC and MEMS fabrications. Skin reliability is greatly improved by a strong periphery of the silicon islands formed by vertical reactive ion etching ("RIE"). Moreover, the inventors have realized one embodiment as a 2-D flexible skin integrated with shear stress sensors. These flexible skins can be about 3 cm long and about 1 cm wide, and include about 100 sensors. The skin polyimide is about 17 µm thick and the silicon islands are about 75 µm thick. These skins have been successfully taped on a semi-cylindrical (about 1.3 cm diameter) delta wing leading edge to perform real-time 2-D shear stress profiling. This has allowed experimental real time detection of the air flow boundary layer over the leading edge of a delta wing.

DETAILED DESCRIPTION

Figure 1A:
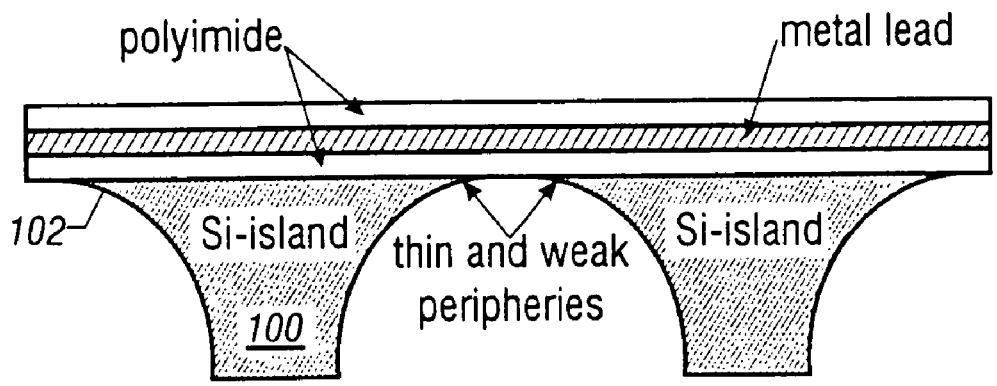
FIGS. 1A, 1B, and 1C illustrate a prior art method of forming Si islands on a polyimide film.

The inventors believe that many of the failures of flexible skins in prior art systems were caused by thin peripheries on Si islands. These thin peripheries break during squeezing and folding tests. As shown in FIG. 1A, forming Si islands 100 by isotropic HNA etching resulted in thin and weak Si island peripheries 102.

Figure 1B:
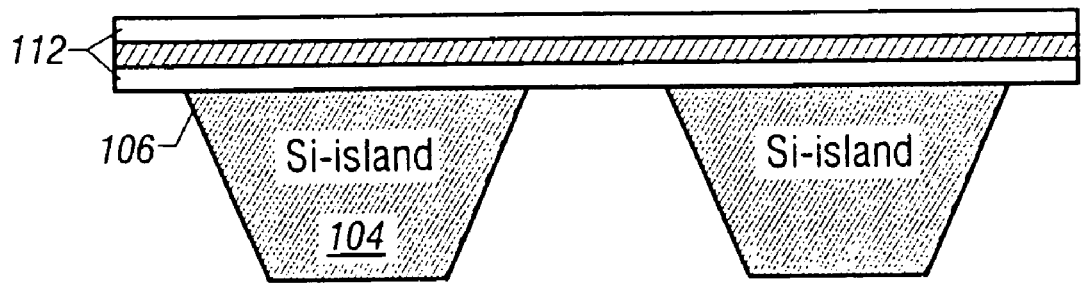
Figure 1C:
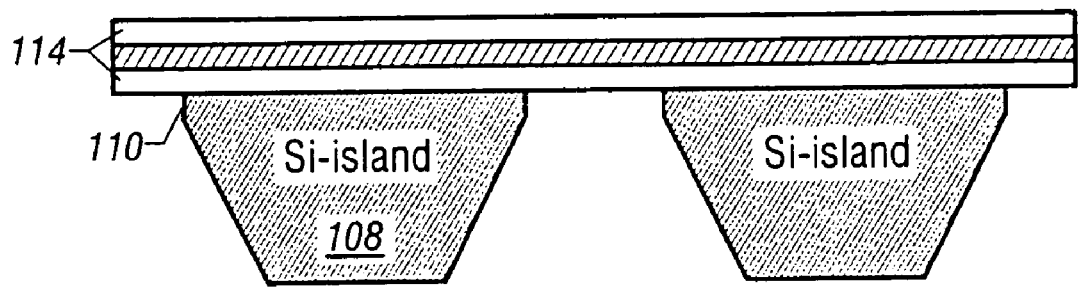

In comparison, as shown in FIGS. 1B and 1C demonstrate the structural difference that is obtained when etching with caustic anisotropic etchants such as tetramethylammonium hydroxide ("TMAH") or potassium hydroxide ("KOH"). This etching forms Si islands 104 which are much more robust when subjected to squeezing and folding. The Si islands 104 formed are in a trapezoidal shape. The resulting Si islands 104 have island peripheries 106 that are thicker and stronger than the corresponding island peripheries 102 shown in FIG. 1A. As shown in FIG. 1C, the combination of anisotropic etching and reactive ion etching ("RIE") results in Si islands 108 which have island peripheries 110 which may be even thicker and stronger. The RIE etching removes the edge portions of the Si islands 108 leaving island peripheries 110 which are substantially vertical.

Unfortunately, these caustic etchants attack all types of polyimides, which would damage exposed layers of polyimide, such as polyimide layers 112 in FIG. 1B and polyimide layers 114 in FIG. 1C. Hence part of the technique includes extra selectivity in etching. One way is by using coated polyimide layers after the islands are formed. Alternately, other protection from the etchants during the etching can be used. Gold or other expensive metals can be used as the protection materials. A one-sided etching device can be used. However, this alternative is not only costly, but also incompatible with IC processing. A one-sided etching apparatus is not easily usable since the pressure difference between the two sides can cause problems, including the rupture of the polyimide near the end of the etching. Moreover, any small leak on the wafer near the end of the etching might also allow attack of the polyimide on the front side.

Figure 2A:
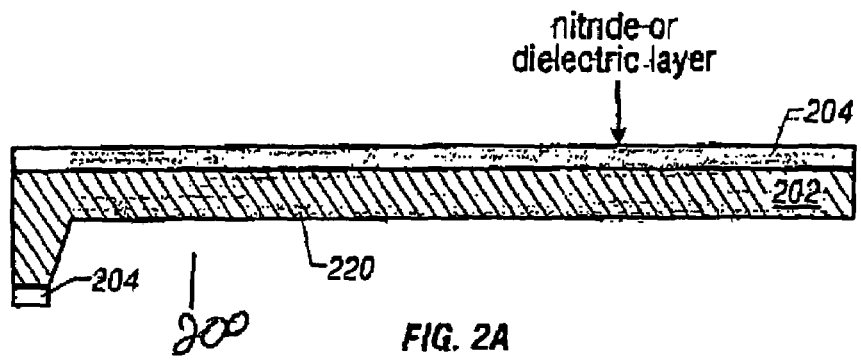
FIGS. 2A, 2B, and 2C illustrate the preferred technique of forming Si islands.
Figure 2B:
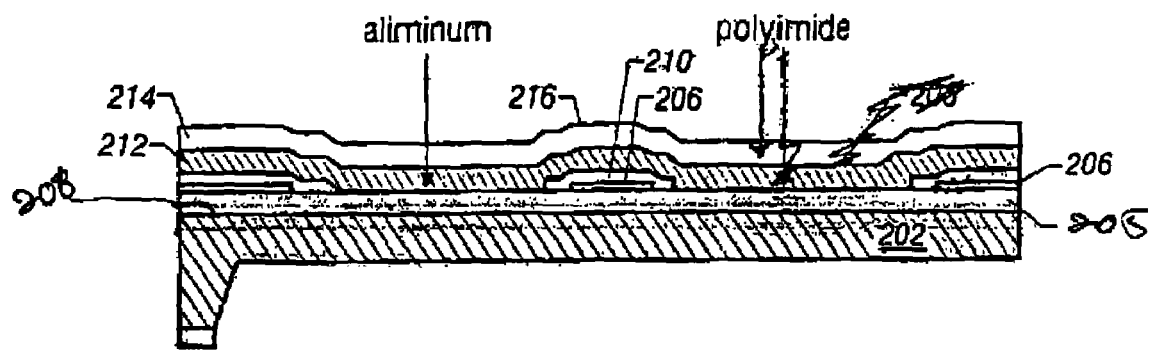
Figure 2C:
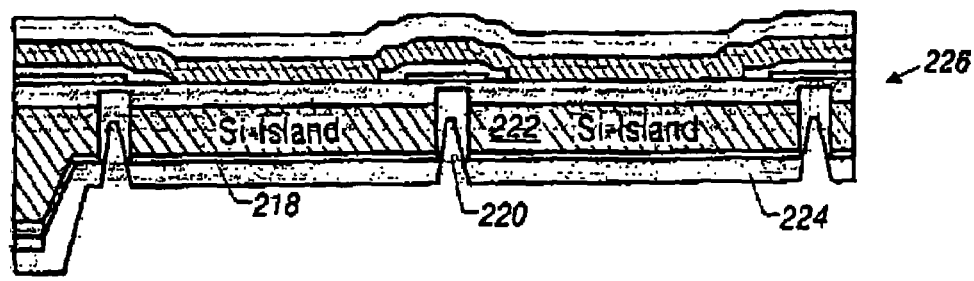

FIGS. 2A to 2C show the intermediate steps of the preferred mode of fabrication for forming flexible skins.

The process starts with FIG. 2A which uses selective TMAH or KOH etching on the back side 200 of a Si wafer 202. Silicon nitride 205 is used as a mask. This etching brings the Si wafer 202 to a desired thickness, preferably about 10–500 μm.

As shown in FIG. 2B, a first aluminum layer 206 is then evaporated on silicon nitride 205 on the front side 208 of the Si wafer 202. The first aluminum layer 206 is then patterned. A first polyimide layer 210 is spun-on (preferably about 1–100 μm thick), cured and patterned to cover the patterned first aluminum layer 206 completely. Conventional aluminum metallization then follows to form a second aluminum layer 212 which is used for electrical metal leads. A second polyimide layer 214 is spun-on and patterned to form bonding pads 216.

As shown in FIG. 2C, $SF_6$-based vertical RIE etching is performed on the back side 200 of the Si wafer 202 using aluminum, 218 as masking material. The top layer of aluminum 206 serves as an etch stop in the RIE etching. This RIE etching removes a vertical block of Si material, hence forming "streets" 220 defining Si islands 222.

A third polyimide layer 224 is spun-on and cured on the aluminum mask 218, at least partially filling the streets 220, to cover both sides of the Si islands 222. Since the islands are formed by RIE, they may have the shape shown in FIG. 1B or FIG. 1C. This process leaves finished flexible skins 226 in a Si wafer frame. The flexible skins 226 are then preferably cut off from the remaining Si wafer frame by a razor blade.

Because the above description was to explain the concepts involved, the flexible skin described did not contain sensors or other IC devices. However, the above process is compatible with IC processing because the above process involves only aluminum and polyimide which are commonly used in IC fabrication. Using a wafer with fabricated IC and/or MEMS devices (without metallization), the above process needs only minimal adjustment to produce flexible MEMS skins. An example of such flexible MEMS skins are discussed below.

In the above process of FIGS. 2A to 2C, the Si islands 222 are formed by vertical RIE etching performed on the Si wafer 202. Because the Si wafer 202 thickness is less than about 100 μm after the initial etching (see FIG. 2A) and the RIE etching is substantially vertical, Si islands 222 can be well-defined with dimensions as small as about 100 μm and spaced less than about 50 μm apart. Such sizes make it possible for the flexible skin to be applied on a very high-curvature surface with good conformal coverage. Good coverage of very high-curvature surfaces may be more difficult if the island shaping techniques shown in FIG. 1A are used because, e.g., HNA etching is isotropic. TMAH or KOH etching as shown in FIG. 1B can be used, however it may require large corner compensation structures to avoid fast undercut on corners.

The preferred embodiment uses polyimide as flexible skin material. This material has good mechanical strength and flexibility. Preferably, DuPont's™ PI-2808™ polyimide is used which has a tensile strength of about 210 MPa. This value is one of the highest among the spin-coated polyimides presently available. This is almost as high as the tensile strength of Kapton™ which is also a product made by DuPont™. Kapton™'s tensile strength is about 231 MPa and commonly used as a flexible runner for providing reliable connections to moving print heads.

In the above process shown in FIGS. 2A to 2C, the thickness of each of the polyimide layers 210, 214 on the front side of the Si wafer 202 is about 3–4 μm after curing at about 350° C. Because the polyimide layers 210, 214 have not been exposed to strong acids or bases during the above process, their mechanical properties should not be degraded. Accordingly, a total of about 7 μm of polyimide on the front side of the Si wafer 202 provides the ability to withstand a tensile force of about 1.47 kg/mm, which is fairly strong.

However, the peel-off forces of polyimide from Si substrates given by the manufacturer is only about 0.23 g/mm. Therefore, even a small shear force exerted on a Si island might peel the Si island away from the polyimide.

A preferred solution to this problem is to spin a thick polyimide layer 224, e.g., of about 10 μm, on the back side of the Si wafer 202 to fully encapsulate the Si islands 222. This raises the maximum tensile force that the flexible skin 226 can stand.

As shown in FIGS. 2A to 2C, the second aluminum layer 212 used to form metal leads is completely embedded in two polyimide layers 210, 214 on the front side of the flexible skin 226. Also, the Si islands 222 on which the aluminum layers 206, 212 are resting do not have weak edges. Therefore, the Si islands 222 should be able to stand repetitive squeezing and bending without breaking. By way of example, in initial testing of flexible skins constructed according to the technique described above, no metal lead failure was observed after more than 100 times of 90°–180° bending.

If for some reason the first polyimide layer 206 can not be used, the first layer can be other IC-compatible low temperature dielectric materials such as low temperature oxide ("LTO"). Moreover, if some more advanced Si dry etching technologies, such as deep RIE, are available, the etching of the back side 200 of the Si wafer 202 by KOH or TMAH can be replaced by such advanced dry etching techniques. In this case, the etching can also be delayed until before the third aluminum layer 218 is deposited.

In a preferred embodiment of the present invention, a flexible shear stress sensor array is constructed according to the method described below. This embodiment shows a useful MEMS device integrated on a flexible substrate using the flexible skin technology described herein.

A shear stress sensor is a vacuum-insulated diaphragm-type thermal sensor capable of measuring wall shear stress exerted by viscous flow. Such sensors are useful in turbulent flow study. For example, arrays of shear stress sensors on a rigid substrate have been used in the past to detect real-time shear stress distribution on a flat (i.e., 2-D) surface for flow-induced drag reduction study. However, the application of shear stress sensor arrays have been limited to 2-D flow because of limitations in flexible packaging. A flexible shear stress sensor array will allow extending that application to 3-D flow. In addition, the fabrication of shear stress sensors is a surface micromachining process with reasonably high complexity. The preferred embodiment is a good demonstration of the compatibility between the flexible skin of the present invention and MEMS technologies.

Figure 3A:
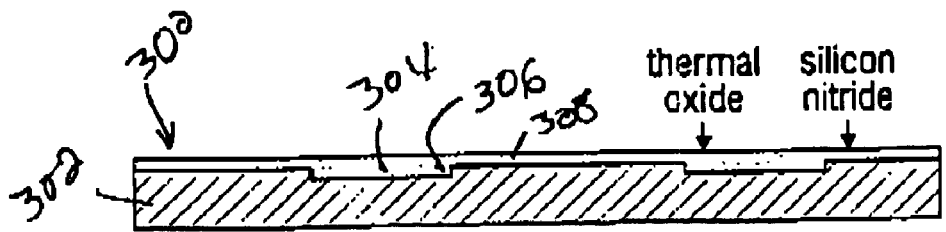
FIGS. 3A to 3H illustrate a fabrication process for a flexible shear stress sensor skin according to the present invention.
Figure 3B:
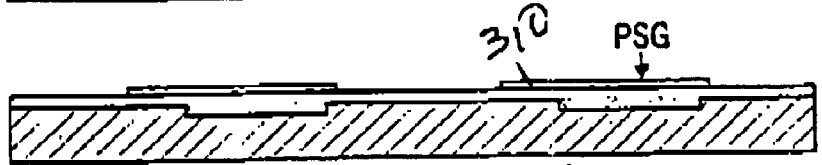
Figure 3C:
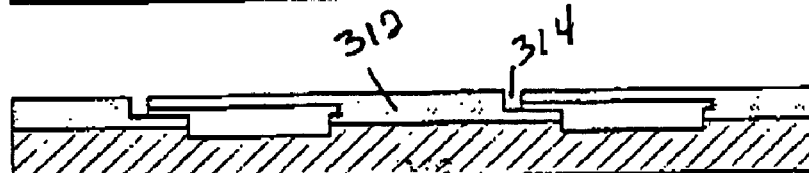
Figure 3D:
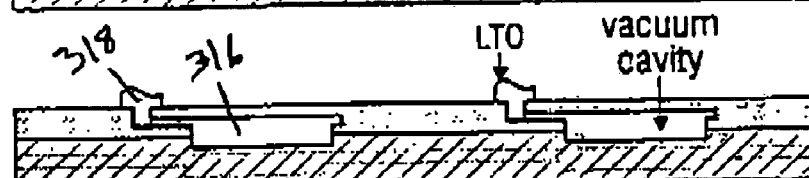
Figure 3E:
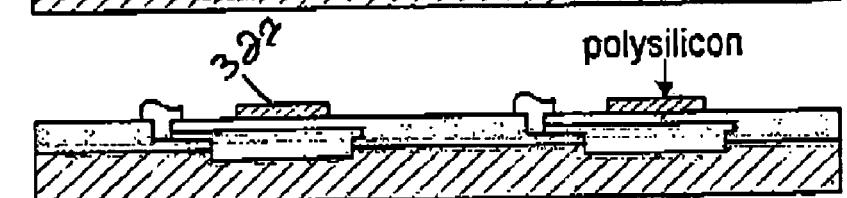
Figure 3F:
Figure 3G:
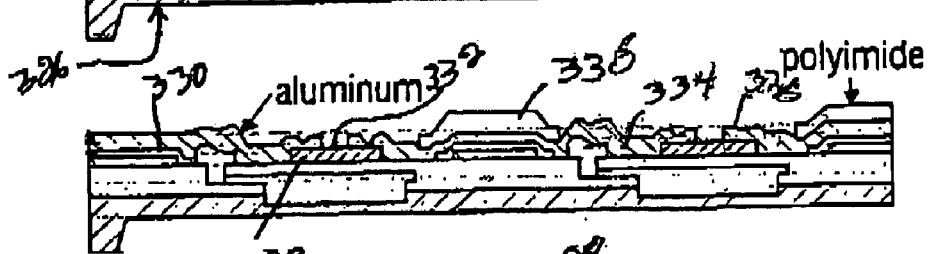
Figure 3H:
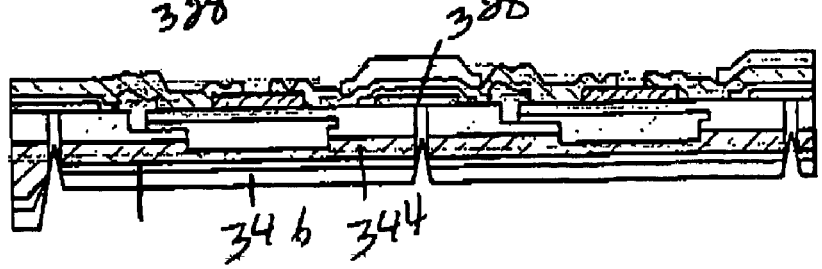

FIGS. 3A to 3H show steps of the fabrication process flow of a preferred embodiment of a flexible shear stress sensor array (348 in FIG. 3H). This fabrication process combines elements of the fabrication processes of the shear stress sensor and the skin.

First, as shown in FIG. 3A, a front side 300 of a silicon wafer 302 is etched through local oxidation of silicon (LOCOS). This oxidation leaves thermal oxide 304 in recesses 306 on the front side 300 of the Si wafer 302. A layer of silicon nitride 308 is applied to cover the front side 300 of the Si wafer 302 including the thermal oxide 304.

In FIG. 3B, phosphosilicate glass ("PSG") 310 is deposited over the silicon nitride layer 308. The PSG 310 is patterned to cover the underlying thermal oxide 304 deposits to form PSG sacrificial layers 310.

In FIG. 3C, a nitride diaphragm 312 is deposited on top of the PSG sacrificial layers 310. Etch holes 314 are opened in the nitride diaphragm 312 exposing an end of each of the PSG sacrificial layers 310. In FIG. 3E, the PSG sacrificial layers 310 and underlying thermal oxide 304 are selectively etched to create cavities 316. Using a low pressure chemical vapor deposition (LPCVD) low temperature oxide (LTO)/nitride oven, LTO cavity seals 318 are placed in each of the etch holes 314 creating vacuum cavities 320 in the cavities 316 which held the PSG 310 and thermal oxide 304. In FIG. 3E, a polysilicon layer 322 is then deposited on top of the nitride diaphragm 312. The polysilicon layer 322 is doped and patterned to remain only above the vacuum cavities 320. A thin nitride layer 324 is deposited for passivation.

Similar to the process described above with reference to FIGS. 2A to 2C, in FIG. 3F, TMAH or KOH is used to etch the back side 326 of the Si wafer 302 to a desired thickness, preferably about 10–500 $\mu$m. The layers on the front side of the Si wafer 302 are protected by the LTO 318 and nitride 324.

In FIG. 3G, a first aluminum layer 328 is deposited and patterned. A first polyimide layer 330 is deposited over the patterned first aluminum layer 328. Contacts 332 are opened after the first aluminum/polyimide processing, so these contacts 332 are fresh and clean for the following metallization. A second aluminum layer 334 is deposited, leaving the contacts 332 open. Then a second polyimide layer 336 is deposited and patterned to cover areas above the first aluminum layer 328, forming bonding pads 338. In FIG. 3H, RIE etching is performed on the back side of the Si wafer 302 using a third aluminum layer 340 as masking material. The patterned first aluminum layer 328 act as etch stops. The RIE etching removes Si to form streets 342 between Si islands 344. Finally, a polyimide layer 346 is deposited on the back side of the Si wafer 302, covering the third aluminum layer 340 and partially filling the streets 342 between Si islands 344. Preferably the total thickness of the polyimide layers 330, 336, 346 is about 1–100 $\mu$m.

One embodiment of the present invention has been constructed according to the technique described above referring to FIGS. 3A to 3H as a flexible skin integrating shear stress sensors. The flexible skin is about 1 cm wide, about 3 cm long, and includes two 32-sensor rows with a horizontal pitch of about 635 $\mu$m and many other test devices (a total of more than 100 sensors). The two sensor rows are about 5 mm apart and located between the pairs of white square boxes in the picture. Their bonding pads are extended to left and right edges of the flexible skin. The layout is designed in such a way that each sensor row spans a semi-cylindrical surface (about 1.3 cm in diameter) of a delta wing leading edge under study with an angular resolution of about 5.6°. Each sensor occupies about 250×250 $\mu M^2$ and the dimensions of each Si island are about 450 $\mu$m×550 $\mu$m (about 75 $\mu$m thick) to fully accommodate one sensor and to achieve excellent surface smoothness and conformability.

A flexible MEMS skin technology has been developed and which is compatible with IC processing. A major failure of conventional technologies has been eliminated through the proper shaping of Si islands according to the present invention. Moreover, using the process of the present invention, Si islands as small as 100 $\mu$m can be defined with good accuracy, which allows the skins to be applied on small surfaces with large curvatures. A first application of this technology has produced a flexible shear stress sensor array that was used in aerodynamics for the real-time measurement of shear stress distribution on 3-D surfaces.

Test Results

As an example of the application of the technique described above, flexible shear-stress sensor skins for aerodynamics study have been fabricated according to the preferred method of the present invention. Accordingly, the embodiment described below and the corresponding test results are demonstrative of one embodiment and are not restrictive limitations.

The finished skin is about 3 cm long and about 1 cm wide, including about 100 sensors. The skin polyimide is about 17 $\mu$m thick and the silicon islands are about 75 $\mu$m thick. These skins have been successfully taped on a semi-cylindrical (about 1.3 cm diameter) delta wing leading edge to perform real-time 2-D shear stress profiling.

Figure 4:
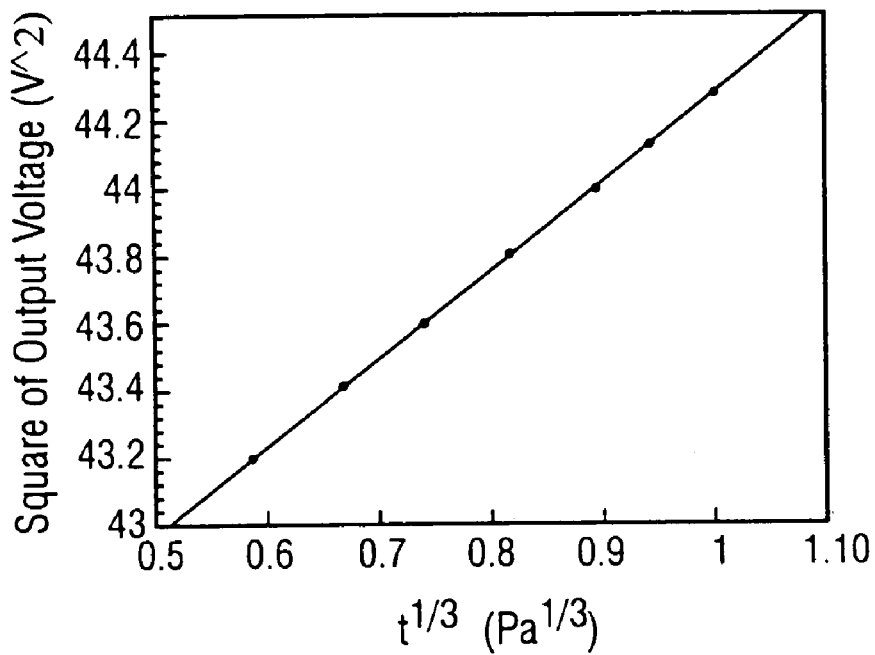
FIG. 4 shows calibration results of a sensor of a flexible skin on a flat surface.
Figure 5:
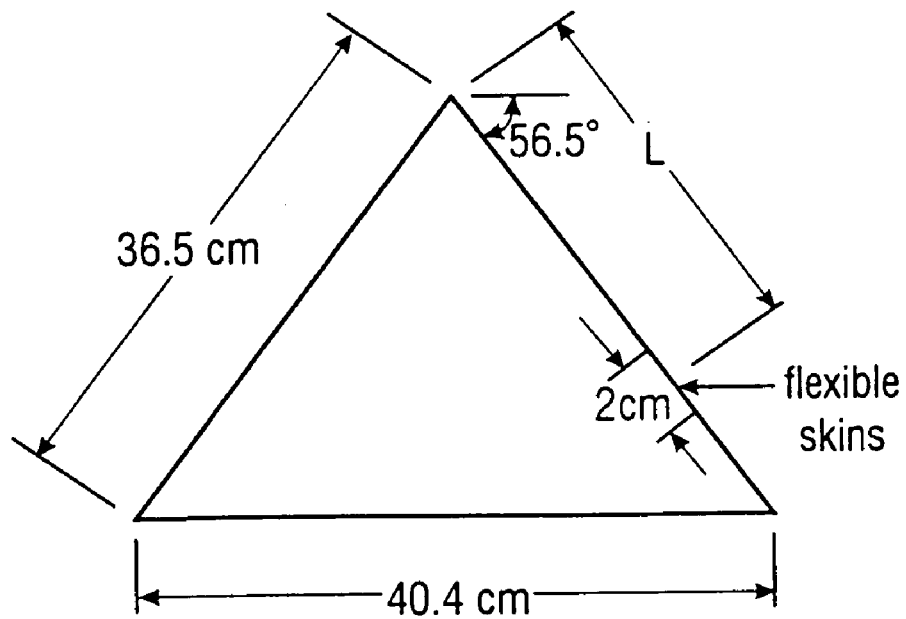
FIG. 5 is a schematic of a delta wing.

To test the shear stress sensor skin, the skin is first flush-mounted on a wind-tunnel where controlled shear flow is available for sensor calibration. The sensors on the flexible skin have been found to behave the same as those on rigid substrates. FIG. 4 shows calibration results where the square of the output voltage is proportional to the one-third power of shear stress $\tau$ and the sensitivity is about 100 mV/Pa under constant temperature bias. Next, the skins are mounted on one of the two 3-D leading edges of a delta wing. The leading edge is divided into many blocks of removable semi-cylinders 2 cm long and 1.3 cm in diameter. The sensor block is recessed by about 100 $\mu$m to compensate for the skin thickness.

At this point, only one row of sensors is used to measure the instantaneous distribution of shear stress on that location. By moving the skins along the whole leading edge block by block, we are able to map out the steady-state shear stress distribution.

Figure 6:
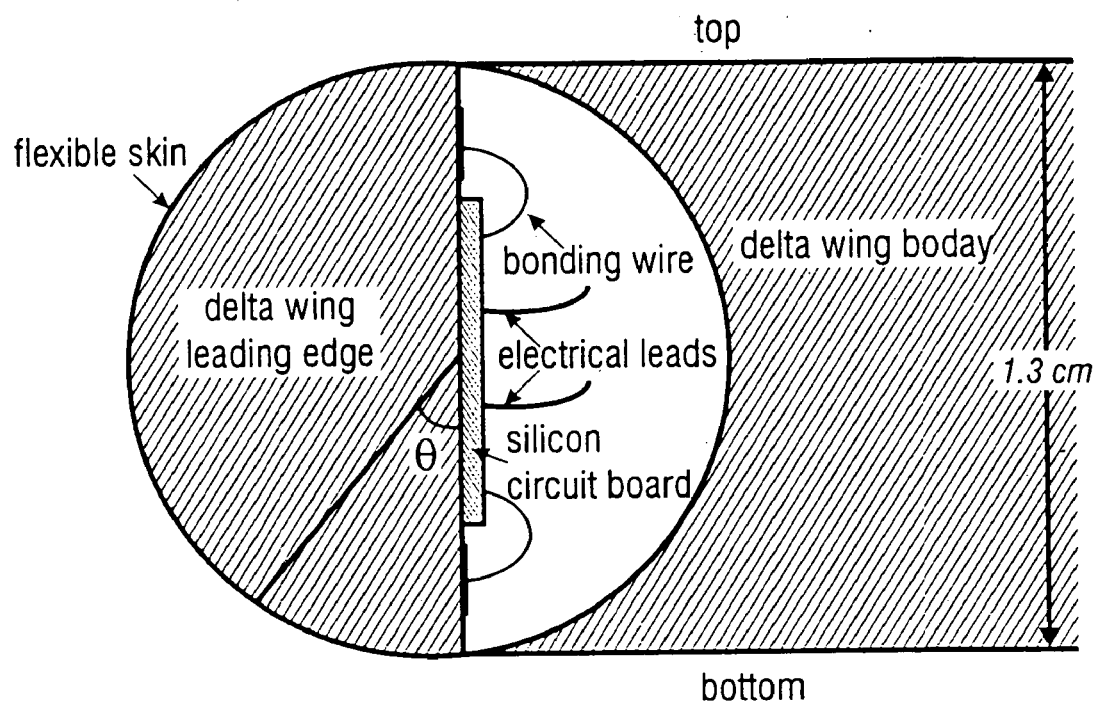
FIG. 6 shows a cross section of a flexible skin on a delta wing edge.

FIG. 6 shows a schematic of the cross section of a packaged sensor block for delta wing test. First, two skins are glued to the semi-cylinder with the sensors on the curved surface and the bonding leads/pads extended to the flat surface. Then a circuit board with pre-soldered wires is attached to the flat surface next to the bonding pads of the skins. Ultrasonic wire bonding is performed to connect the leads to the circuit board and then the bonding wires are fixed by epoxy. Here, the circuit board is a piece of Si with gold bonding and soldering pads specially designed and fabricated for this purpose.

Figure 7:
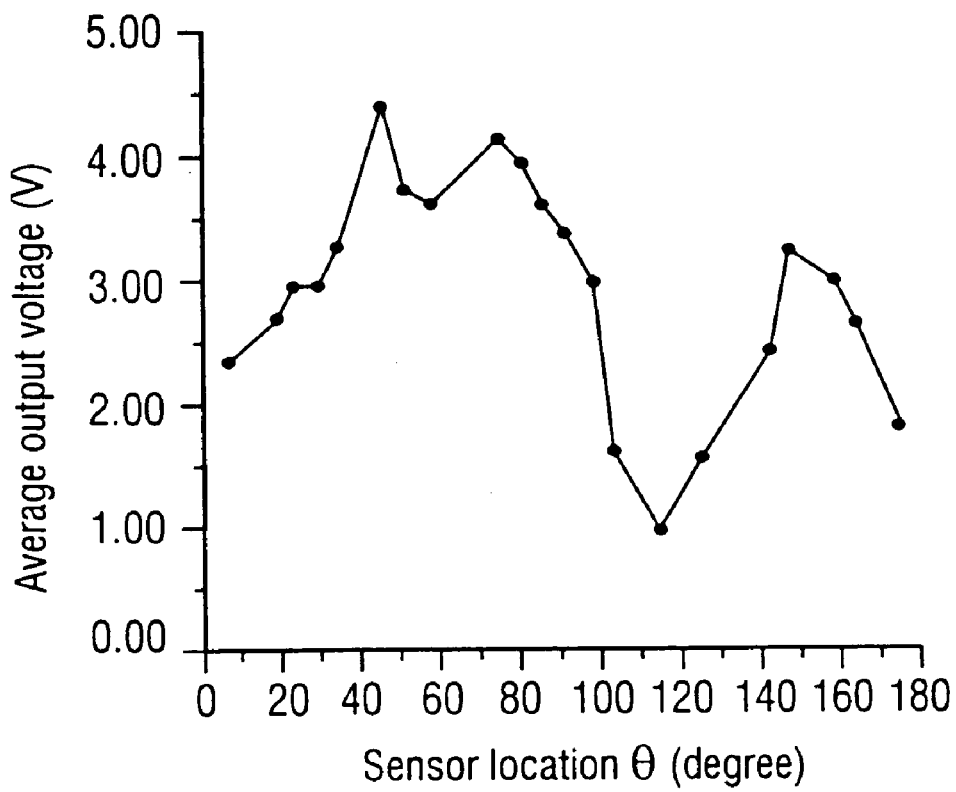
FIG. 7 shows averaged output from one row of sensors on a flexible skin according to the present invention.

Measurements have been done under different flow velocities (U), skin locations (L) and angles of attack (AOA, defined as the angle between the air flow and the delta wing plane). For example, FIG. 7 shows the averaged output voltages (after gain of 10) of the sensors for U=30 m/s, L=29 cm and AOA=30°. Sensor locations are indicated by θ, which is 0° at the bottom surface and 180° at the top surface. The averaged shear stress has a minima at about 110°, which is a result of flow over the cylinder.

Figure 9:
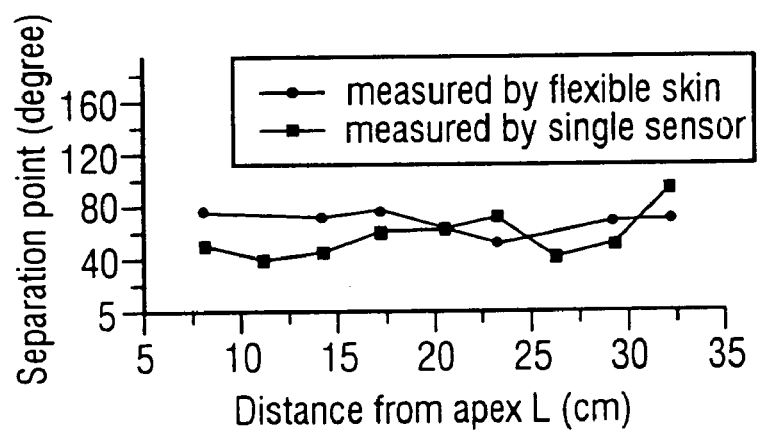
FIG. 9 shows a comparison of separation lines measured by a single sensor and a flexible shear stress sensor array according to the present invention.
Figure 8:
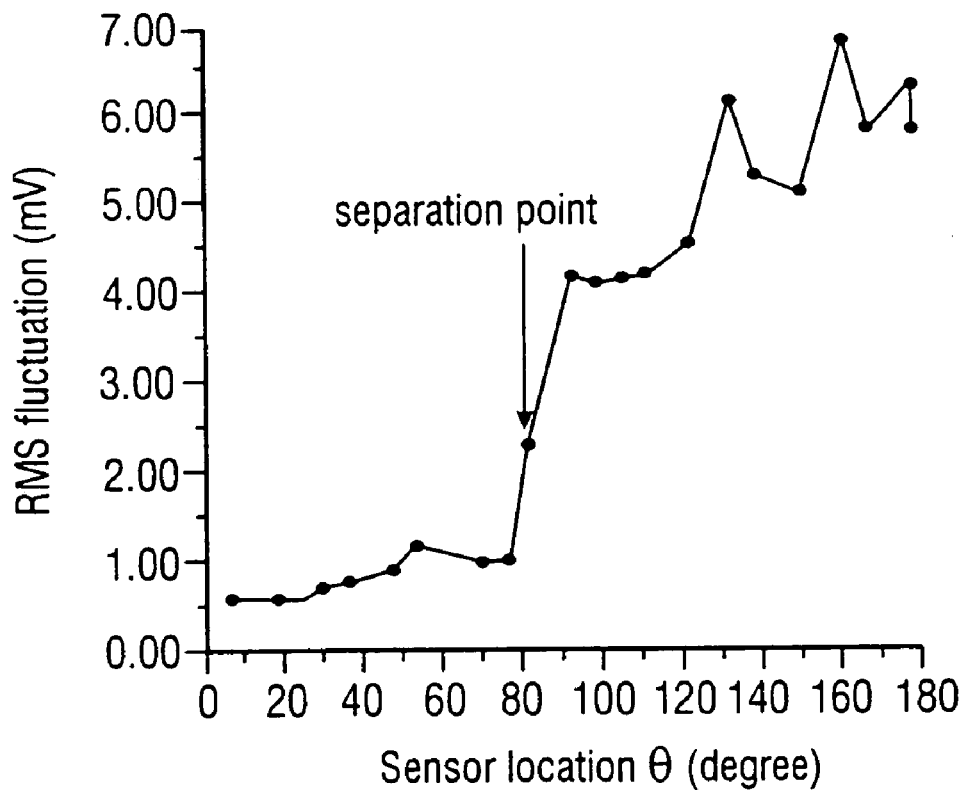
FIG. 8 shows RMS fluctuation used to identify a flow separation point.

The flow separation point is where the flow boundary layer starts to separate from the leading edge surface. Determining the flow separation point is non-trivial. Typically, the surface shear stress fluctuation stays low before separation, and rises sharply after separation. Therefore, a flow separation point can be identified through measurement of the root-mean-square (RMS) value of shear stress fluctuation. FIG. 8 shows the RMS results of one measurement, from which the separation point is found to be at θ=80°. These results reflect the experimental determination of flow separation points in real time. The separation line along the leading edge is consistent with the data measured from a single shear stress sensor that was placed around the leading edge point by point in steady state flow (FIG. 9). Based on this data, for real time flow control, a single sensor is no longer adequate. Flexible shear stress arrays are necessary because the flow separation point along the leading edge is a function of changing U, 2L and AOA in real flow field.

What is claimed is:

1. A flexible microelectronic device, comprising:
a first silicon island, having portions of sidewalls which are substantially vertical, and having a first sidewall and a top surface;
a second silicon island, also having portions of sidewalls which are substantially vertical, and also having a top surface, said second silicon island having a first side wall which is facing but spaced from said first sidewall of said silicon island;
an aluminum contact layer, coupled to said top surface of said first silicon island, and coupled to said top surface of said second silicon island, and extending across a gap between said first and second silicon island and aligned with said gap and covering an entire area between said first and second silicon islands; and
a protective layer, covering a top and bottom surface of said aluminum contact layer.

2. A device as in claim 1, wherein said protective layer is formed of polyimide.

3. A device as in claim 1, further comprising a first electronic sensor on said first silicon island, and a second electronic sensor on said second silicon island, which first and second electronic sensors are electrically connected by said aluminum contact layer.

4. A device as in claim 3, wherein said first and second electronic sensors each comprise a vacuum cavity and diaphragm, used to detect strain.

5. A device as in claim 1, wherein each of said first and second silicon islands are about 450 μm by 550 μm, and about 75 μm thick.

6. A flexible microelectronic device, comprising:
a plurality of silicon islands, arranged in a two-dimensional matrix, each silicon island having four sidewalls defining edges of each silicon island, a top surface, and a bottom surface;
at least a plurality of said silicon islands adjoining other silicon islands, but spaced therefrom to form spaces between said sidewalls of said silicon islands;
each of said spaces covered by an aluminum contact layer, which covers an entire space between said two adjacent silicon islands, and which connects to each of said two adjacent silicon islands, to allow electrical contact therebetween;
a first protective layer of a flexible material, covering bottom surfaces of each of said silicon islands; and
a second protective layer of a flexible material, covering top surfaces of said silicon islands and covering said aluminum contact layer.

7. A device as in claim 6, wherein said first and second protective layers are formed of a flexible material.

8. A device as in claim 7, wherein said first and second protective layers are formed of polyimide.

9. A device as in claim 8, wherein at least one of said protective layers is a polyimide layer which is at least 10 μm thick.

10. A device as in claim 6, further comprising a sensor coupled to each of said plurality of silicon islands, and said sensor producing signals which are coupled by said aluminum contact layer.

11. A device as in claim 10, wherein said sensors are strain sensors.

12. A device as in claim 10, wherein said sensors each include a vacuum cavity, and a diaphragm mechanically coupled to said vacuum cavity, which collectively act to detect stresses on the diaphragm.

13. A two-dimensional, distributed, microelectronic sheer sensor array, comprising:
a plurality of silicon islands arranged in a two-dimensional matrix, each of the silicon islands including a plurality of sidewalls defining edges of the silicon island, a top surface, and a bottom surface, said top surface including a vacuum cavity formed therein, and a diaphragm in contact with the vacuum cavity, and said diaphragm sensing strain to the vacuum cavity to produce a signal indicative of the strain on the diaphragm:
a plurality of aluminum contact layers, each aluminum contact layer aligned with a gap between two adjoining silicon islands in the two-dimensional matrix, and connected between and extending over said gap and covering an entire gap between said adjacent silicon islands and aligned with said gap, and electrically connecting between said signals on each of said silicon islands;
a first protective layer of a flexible material, covering at least tops of said silicon islands, and said aluminum contact layers; and
a second protective layer of the same flexible material as said first protective layer, covering at least bottoms of said silicon islands.

14. An array as in claim 13, wherein said first and second protective layers are formed of polyimide.

15. An array as in claim 14, wherein said polyimide layers are at least 10 μm thick.

* * * * *